United States Patent [19]

Gutierrez, Jr. et al.

[11] Patent Number: 5,243,227
[45] Date of Patent: Sep. 7, 1993

[54] FINE/COARSE WIRED-OR TAPPED DELAY LINE

[75] Inventors: Alberto Gutierrez, Jr., Fort Collins; Christopher Koerner, Longmont, both of Colo.

[73] Assignee: Hewlett-Packard Company, Palo Alto, Calif.

[21] Appl. No.: 786,459

[22] Filed: Nov. 1, 1991

[51] Int. Cl.$^5$ .................. H03K 5/08; H03K 17/00
[52] U.S. Cl. ............................. 307/605; 307/590; 328/104
[58] Field of Search ............... 307/262, 268, 269, 590, 307/600, 601, 602, 603, 605, 243; 328/56, 55, 154, 104

[56] References Cited

U.S. PATENT DOCUMENTS

| 4,028,979 | 6/1977 | Luce . | |
|---|---|---|---|
| 4,473,762 | 9/1984 | Iwahashi . | |
| 4,489,342 | 12/1984 | Gollinger et al. | 307/605 |
| 4,499,387 | 2/1985 | Konishi . | |
| 4,504,749 | 3/1985 | Yoshida | 307/590 |
| 4,626,716 | 12/1986 | Miki | 307/602 |
| 4,638,191 | 1/1987 | Baumgartner et al. . | |
| 4,644,184 | 2/1987 | Miyawaki et al. . | |
| 4,700,089 | 10/1987 | Fujii et al. | 307/605 |
| 4,754,164 | 6/1988 | Flora et al. | 307/269 |
| 4,820,944 | 4/1989 | Herlein et al. | 307/602 |
| 4,845,390 | 7/1989 | Chan | 307/605 |
| 4,899,071 | 2/1990 | Morales | 307/605 |
| 4,922,140 | 5/1990 | Gahle et al. . | |
| 4,947,064 | 8/1990 | Kim et al. | 307/594 |
| 5,012,141 | 4/1991 | Tomisawa | 307/592 |
| 5,081,380 | 1/1992 | Chen . | |

OTHER PUBLICATIONS

"A 10-ps Resolution, Process-Insensitive Timing Generator IC", Otsuji et al., IEEE Journal of Solid-State Circuits, vol. 24, No. 5, Oct. 19, 1989, pp. 1412–1418.

"A 3-ns Range . . . Utilizing Si Bipolar", Otsuji et al., IEEE Journal of Solid State Circuits, vol. 26, No. 5, May 19, 1991, pp. 806–811.

"Integrated Pin Electronics for VLSI Functional Testers", Gasbarro et al., IEEE Journal of Solid State Circuits, vol. 24, No. 2, Apr. 1989, pp. 331–337.

"Bt605 125 MHz 10KH ECL Compatible Programmable Timing Edge Vernier", Brooktree Corp. 9950 Barnes Canyon Rd., San Diego, Calif. 92121, pp. 9-1-7-9-28.

"Integrated Pin Electronics For A VLSI Test System", Branson et al., IEEE 1988 International Test Conference, pp. 23–27.

Primary Examiner—Jin F. Ng
Assistant Examiner—Sinh Tran

[57] ABSTRACT

The present invention is directed to a delay line for providing fine timing adjustment on subsequent edges of an input signal. The delay line comprises a plurality of delay elements for fine tuning the position in time of the timing edges of the input signal. Each delay element has a data input and data output where the data output is connected to the subsequent delay element's data input, thereby forming a delay line with delay elements connected in series. This implementation facilitates the addition of fine increments of delay to be added to the input signal and thereby enable fine tuning of timing edges. Also, included is a wired-OR multiplexor having data inputs connected to the data outputs of the plurality of the delay elements and a control input to select a particular data output to thereby provide an output signal having delayed timing edges.

7 Claims, 2 Drawing Sheets

FINE/COARSE WIRED-OR TAPPED DELAY LINE

CROSS REFERENCE TO RELATED APPLICATIONS

The following applications are of common assignee and contain some common disclosure, and are believed to have an effective filing date identical with that of the present application:

VARIABLE WIDTH CURRENT MIRROR DIGITAL-TO-ANALOG CONVERTER (DAC) SYSTEM AND METHOD FOR GENERATING A CONTROL VOLTAGE FOR DELAY GENERATION, Ser. No. 07/786,690;

PSEUDO-NMOS PROGRAMMABLE CAPACITANCE DELAY ELEMENT, Ser. No. 07/786,633;

CMOS PSEUDO-NMOS PROGRAMMABLE CAPACITANCE TIME VERNIER AND METHOD OF CALIBRATION, Ser. No. 07/786,447; and CMOS PSEUDO-NMOS PROGRAMMABLE CAPACITANCE TIME VERNIER SYSTEM AND METHOD FOR CONTROLLED DELAY OF TIMING EDGES, Ser. No. 07/786,695.

The disclosures of the above listed applications are incorporated herein by reference as if set forth in full below.

BACKGROUND OF THE INVENTION

1. Field of the Invention

The field of the present invention relates generally to electronic systems where accurate and stable signal edge placement is required. More particularly, the present invention relates to a psuedo-NMOS fine/coarse wired-or tapped delay line having both fine and coarse discrete delay elements connected serially.

2. Related Art

Many conventional discrete and gate array devices are used in the electronics industry for adjusting the phase of digital signals. Such phase adjustment is typically accomplished by delaying the rising or falling edge of the digital pulses. Examples of such discrete devices are described in U.S. Pat. No. 4,947,064 to Kim, U.S. Pat. No. 4,899,071 to Morales, and U.S. Pat. No. 4,806,804 to O'Leary. All teach circuits to implement such delays. An implementation of a delay circuit for gate array LSI is taught by U.S. Pat. No. 4,700,089 to Fujii, et al.

However, due to the power supply, temperature, and manufacturing process variations the discrete amounts of delay produced by the conventional circuits can vary. Such inaccuracies are acceptable in most general applications of the delay elements, but are unacceptable for systems such as testing and calibrations systems.

SUMMARY OF THE INVENTION

The present invention provides a system and method that can be used for integrated circuit testing in computer test systems. Further, the present invention provides fine control of a coarse timing edge input by combining coarse and fine delay generation of timing edges into a single tapped delay line. Fine control of a coarse timing edge is useful for testing and characterizing integrated circuit chips.

The present invention is directed to a delay line for providing fine timing adjustment on subsequent edges of an input signal. The delay line comprises a plurality of delay elements for fine tuning the position in time of the timing edges of the input signal. Each delay element has a data input and data output where the data output is connected to the subsequent delay element's data input, thereby forming a delay line with delay elements connected in series. This implementation facilitates the addition of fine increments of delay to be added to the input signal and thereby enable fine tuning of timing edges. Also, included is a wired-OR multiplexor having data inputs connected to the data outputs of the plurality of the delay elements and a control input to select a particular data output to thereby provide an output signal having delayed timing edges.

FEATURES AND ADVANTAGES OF THE INVENTION

The present invention overcomes the deficiencies of the prior art, as noted above, and further provides for the following advantages.

First, one advantage of using the present invention is the combination of fine and coarse delay generation into a single tapped delay line.

Second, the present invention utilizes a pseudo-NMOS implementation which enables a control voltage to be used to set the speed of the device; in essence, an adjustable control is provided so that a user can compensate for process variations, for example.

Third, the present invention is implemented using a pseudo-NMOS technology, which is compatible with CMOS technology, thereby providing more functionality at a greatly reduced power requirement compared to similar implementations with other technologies requiring more power. As a result, this system is more easily integrated with other systems that are implemented using CMOS rather than, for example, bi-polar technology. Further, since CMOS provides more functionality and reduced power consumption compared to bi-polar technology, the need for water cooling required for some applications using bi-polar parts is eliminated.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

DETAILED DESCRIPTION OF THE PREFERRED EMBODIMENTS

Figure 1:
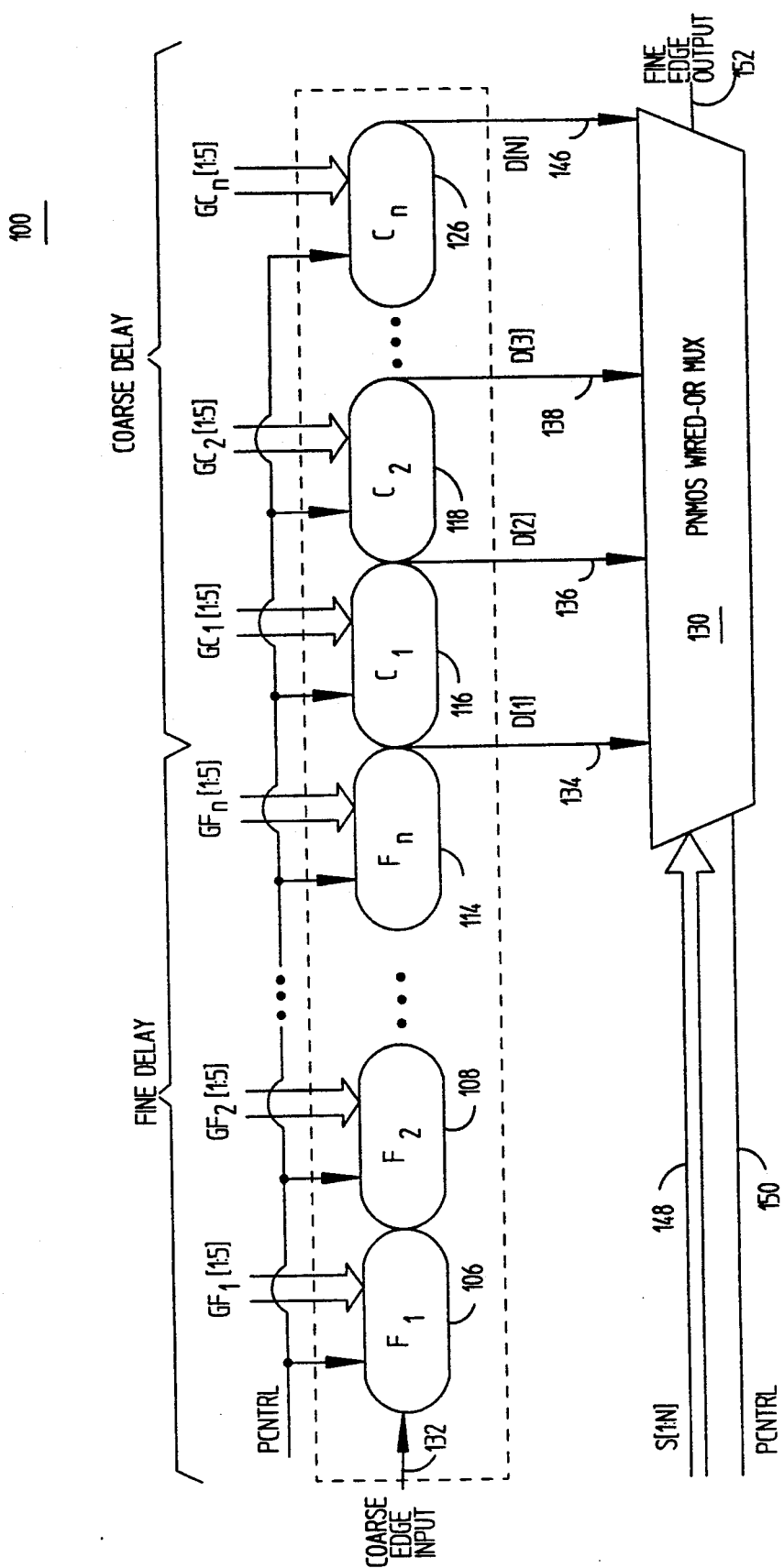
FIG. 1 is a high level logic diagram of a preferred embodiment of the architecture of the present invention.

The present invention provides a method of using a structural combination of delay elements described in detail in the above referenced application Ser. No. 07/786,633. Specifically, a group of delay elements are stacked together so that the data output from one delay element is connected to the data input of a next delay element. A portion of this group of stacked delay elements is utilized to add coarse increments of delay to an input timing edge; another portion of this group of stacked delay elements is utilized to add finely controlled increments of delay in addition to the added coarse delay; and a portion of this group may also be used for calibration of the present invention.

The pseudo-NMOS wired-OR multiplexor (MUX) consists of pseudo-NMOS (PNMOS) OR circuits each with an open drain output. The open drain outputs are all electrically connected to a single PMOS pull-up FET whose gate is driven by the control voltage PCNTRL. One input of each PNMOS OR is driven by a delay line tap. The other input of each PNMOS OR is driven by a select input which functions to enable or disable the particular tap. In one embodiment of the present invention only one tap may be enabled at a time. Upon an incident edge on the enabled tap, the signal will then propagate through the PNMOS OR circuit and pull down the common PMOS pull-up FET, thus propagating the tapped signal to the output of the MUX. The common pull-up FET with all open drain nodes "wired" (electrically connected) to it acts as an OR gate (wired-OR) allowing the active tap to propagate to the output.

Moreover, the control voltage (described in detail in the above referenced application Ser. No. 07/786,690, which provides the delay elements the ability to compensate for temperature, is also utilized by the PNMOS implementation of the wired-OR MUX. Therefore, the PNMOS wired-OR MUX also compensates for temperature, power supply and process variations.

The present invention has applicability in integrated circuit test environments where a programmable delay, which is stable with respect to power supply and temperature variations, is required. This requirement is necessary to isolate specific behavior of a circuit-under-test from a tester.

In accordance with the present invention, the architecture comprises a group of delay elements described in detail in above-referenced application Ser. No. 07/786,633 that are chained together in a row with the output of one delay element connected to the input of a next delay element. Although the number of delay elements varies as determined by a particular application, a preferred embodiment shows that the first three elements are used for fine delay; and the next seven elements are used for coarse delay. A pseudo-NMOS implementation provides an ability to compensate for process, temperature, and power supply, variations. Therefore, the first three delay elements of the delay line are used to obtain a fine adjustment on a coarse delay that is obtained from the remaining seven coarse delay elements of the delay line, which is tapped off through the wired-OR MUX. This tapping off through the wired-OR MUX provides a method with improved linearity and matching between the coarse elements since all the structures are equivalent.

Pseudo-NMOS implementations are utilized for delaying negative timing edges. Further embodiments of the present invention include pseudo-PMOS circuits for controlled delay of positive timing edges. Still further embodiments of the present invention include pseudo-NMOS/PMOS circuits for controlled delay of both negative and positive edges. This particular delay can be accomplished by either alternating a pseudo-PMOS element and a pseudo-NMOS element or by constructing an element with both PMOS and NMOS control voltages.

In brief, the present invention is a system and method for providing fine control of a coarse timing edge input by combining coarse and fine delay generation of timing edges into a single tapped delay line. The present invention is shown at a high level architectural perspective in FIG. 1.

Referring now to FIG. 1, a logic diagram is shown of the high level structure comprising a preferred embodiment of a delay line 100 of the present invention. The delay line 100 comprises a delay element chain 106-126 and a PNMOS wired-OR MUX 130. The delay element chain 106 comprises fine delay elements $F_1, F_2, \ldots F_n$ and coarse delay elements $C_1, C_2, \ldots, C_n$. A coarse timing edge data signal CE is applied to a delay element chain input 132.

The number of delay elements is determined by the desired application of the delay line 100. The number of fine delay elements $(F_1, F_2, \ldots, F_n)$ is chosen such that the combined range of the fine delay elements cover one coarse delay, but does not exceed a maximum intrinsic delay specification such that:

Intrinsic_delay = Fine_intrinsic_delay + MUX_delay

Total_delay = Intrinsic_delay +
Fine_programmed_delay +
Coarse_programmed_delay

The fine delay is obtained by controlling the capacitor banks (described in the the above-referenced application Ser. No. 07/786,633 of the fine delay elements. The fine delay is added to coarse timing edge data input signal CE.

The delay elements $C_1-C_n$, are utilized as coarse delay elements which generate a coarse delay to be added to coarse timing edge data input CE. The number of coarse delay elements is determined by the range of coarse delay generation desired.

The circuit configuration of the fine and coarse delay elements provides a means for adding small finely controlled amounts of delay to the coarse edge input signal. Each delay element comprises lower order and high order capacitor banks.

Lower order capacitor banks (banks comprised of less than 8 FETs) are rendered active by gate control signals GF1-GF3 or GC1-GC3 (where G, F and C stand for gate, fine and coarse, respectively). Once active (i.e., turned on) the FETs act like capacitors and are configured to delay the coarse input signal. Control signals GF1-G3F and GC1-GC3 are Boolean coded to apply additional capacitance in a linear fashion. The higher order bits (banks comprised of 8 or more FETs) are rendered active by control signals GF4-GF5 and GC4-GC5. The control signals GF4-GF5 and GC4-GC5 are thermometer encoded to minimize device mismatch due to process tolerances. See the above incorporated copending application Ser. No. 07/786,690 for a further discussion of thermometer decoding.

The final fine delay element $F_n$ and all coarse delay elements 116-126 are tapped off at their respective outputs $D[1], D[2], \ldots, D[N]$, by the PNMOS wired-OR MUX 130. A nominal coarse delay is set for each coarse delay element by controlling the respective capacitor banks. Therefore, the PNMOS wired-OR MUX 130 functions to tap off the incident edge after an integer number S[1:N] (determined by the MUX 130 select input bus 148) of nominal coarse delays have been added to the incident edge. The input bus 148 provides individual digital control for each of the tapped output signals D[1]-D[N] which are received by the PNMOS wired-OR MUX 130. The bit size of the input bus 148 is determined by a particular application. In addition, the PNMOS wired-OR MUX 130 receives a control voltage PCNTRL input signal at input 150 which, as described above, functions to control the PMOS gates of the pseudo-NMOS implementation of the PNMOS wired-OR MUX 130.

The delay line 100 enables the fine delay generated by the delay elements $F_1, \ldots F_n$ to be combined with the coarse delay generated by the coarse delay elements $C_1 \ldots C_n$. Therefore, the Fine Edge (FE) output signal 152 is derived from the CE input 132 after adding an appropriate amount of fine and coarse delay. The FE output signal 152 also has a constant intrinsic delay component added by the fine delay and the PNMOS wired-OR MUX 130.

Figure 2:
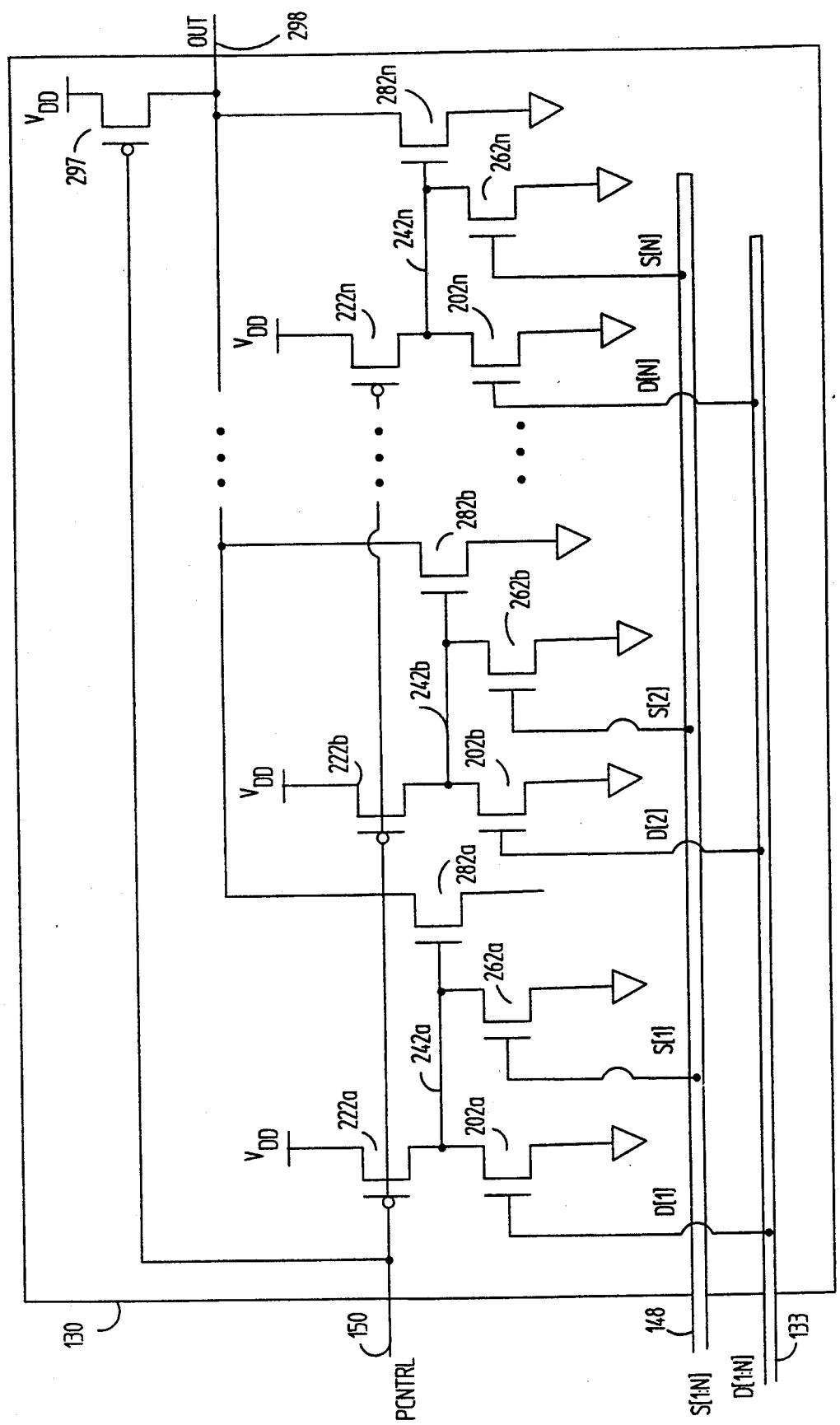
FIG. 2 is a Field Effect Transistor (FET) level diagram of a multiplexor embodiment of Wired-OR MUX 130 of FIG. 1 of the present invention.

FIG. 2 shows a Field Effect Transistor (FET) level diagram of a multiplexor embodiment of the PNMOS wired-OR MUX 130 of FIG. 1 of the present invention. The PNMOS wired-OR MUX 130 is implemented using pseudo-NMOS technology. A bus 133 provides a desired input to MUX 130 from any number (N) of the delay input signals D[1], D[2], D[3], ... D[N], which are shown at reference numbers 134, 136, 138 and 146, respectively. The PNMOS wired-OR MUX 130 receives a control voltage PCNTRL input signal 150 which, as described above, functions to control the PMOS gates of the pseudo-NMOS implementation of the PNMOS wired-OR MUX 130. A "select" bus 148 having N number of inputs (S[1:N]), provides a digital control to select any of the N delay input signals D[1], D[2], ... D[N].

A plurality of NMOS FETs 202a, 202b, ..., 202n are connected to corresponding PMOS FETs 222a, 222b, ..., 222n, to form inverted output nodes 242a, 242b, ..., 242n. Each individual delay input signal D[1]–D[N] is connected to the gate of a corresponding NMOS FET 202. In this PNMOS implementation of the PNMOS wired-OR MUX 130, each PMOS FET 222 is controlled by PCNTRL 150, which thereby provides the same process, power supply and temperature compensation characteristics of pseudo-NMOS as described in detail in the above referenced application Ser. No. 07/786,690 and Ser. No. 07/786,633. Each inverted output node 242 is selectable with a signal S[1:N] select bus 148, which controls an NMOS FET 262a, 262b, ..., 262n connected in parallel to the respective nodes 242. The individual lines on the select bus 148, are negative true and only one select line (S[i], L = 1 to n) is permitted to be active at one time. Finally, the digitally selected node 242, which carries an inverted delay input D[1]–D[N], respectively, is connected to a corresponding NMOS FET 282a, 282b, ..., 282n. Each of these NMOS FETs 282 is connected in parallel to a PMOS FET 297 to form a second inverter which reinverts the selected inverted delay input D[1]–D[N] at respective nodes 242 to provide an output signal 298 that is logically consistent with whichever delay input D[1]–D[N] which was selected by the select bus 148.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What is claimed is:

1. A wired-OR multiplexer (MUX) device for selecting or not selecting an input signal, comprising:
   (a) first and second pseudo-NMOS inverters, each having a data input to receive the input signal, a control input, and a data output;
   (b) a node comprising of a connection between said data output of said first inverter and said data input of said second inverter;
   (c) an adjustable control voltage for applying a biasing voltage to said first and second control inputs of said first and said second pseudo-NMOS inverters to thereby control the amount of charge supplied to said node and said data output of said second pseudo-NMOS inverter; and
   (d) select means connected to said node for permitting or not permitting the input signal to propagate to said data output of said second pseudo-NMOS inverter.

2. A MUX according to claim 1, wherein said first and second inverters each comprise:
   (a) a first field effect transistor (FET) having first gate, source, and drain electrodes;
   (b) a second FET having second gate, source, and drain electrodes, said second gate electrode forming the data input to the inverter, and said second source electrode being connected to said first drain electrode to thereby form the data output of the inverter; and
   (c) means for permitting a voltage supply to be connected to said first source and said second drain electrodes;
whereby changing said adjustable control voltage regulates the amount of current flowing from the voltage supply to the data output.

3. A MUX according to claim 2, wherein said first FET is a p-channel FET and said second FET is an n-channel FET and the combination of said p-channel and n-channel FETs forms a pseudo-NMOS inverter.

4. A tapped delay line system for delaying an input signal, comprising:
   (a) a plurality of fine delay elements for receiving and delaying the input signal, each fine delay element having,
      (i) a data input;
      (ii) a data output; and
      (iii) a control input to receive a fine gate control time delay signal for specifying a predetermined amount of delay for that fine delay element to add to the signal applied to its respective data input;
   wherein said plurality of fine delay elements are coupled in series;
   (b) a plurality of coarse delay elements for receiving the input signal from said plurality of fine delay elements and further delaying the input signal, each coarse delay element having,
      (i) a data input;
      (ii) a data output; and
      (iii) a control input to receive a coarse gate control time delay signal for specifying a predetermined amount of delay for that coarse delay element to add to the signal applied to its respective data input;
   wherein said plurality of coarse delay elements are coupled in series, and the data input of a first one of said plurality of coarse delay elements is coupled to the data output of a last one of said plurality of fine delay elements; and (c) a wired-OR multiplexer having,
  (i) multiplexer data inputs connected to said data outputs of said plurality of coarse delay elements and the data output of the last one of said plurality of fine delay elements;
  (ii) a select control input to select one of said multiplexer data inputs to be output from said wired-OR multiplexer;
  (iii) a multiplexer output; and
  (iv) means for passing said selected one of said multiplexer data inputs to said multiplexer output.

5. A tapped delay line system for delaying an input signal, comprising:
  (a) a plurality of fine delay elements for receiving and delaying the input signal, each fine delay element having,
    (i) a data input;
    (ii) a data output; and
    (iii) a control input to receive a fine gate time delay control signal for specifying a predetermined amount of delay for that fine delay element to add to the signal applied to its respective data input;
    wherein said plurality of fine delay elements are coupled in series;
  (b) a plurality of coarse delay elements for receiving the input signal from said plurality of fine delay elements and further delaying the input signal, each coarse delay element having,
    (i) a data input,
    (ii) a data output, and
    (iii) a control input to receive a coarse gate time delay control signal for specifying a predetermined amount of delay for that coarse delay element to add to the signal applied to its respective data input;
    wherein said plurality of coarse delay elements are coupled in series, and the data input of a first one of said plurality of coarse delay elements is coupled to the data output of a last one of said plurality of fine delay elements; and
  (c) a wired-OR multiplexer having,
    (i) multiplexer data inputs connected to said data outputs of said plurality of coarse delay elements and the data output of the last one of said plurality of fine delay elements;
    (ii) a select control input to select one of said multiplexer data inputs to be output from said wired-OR multiplexer;
    (iii) a multiplexer output; and
    (iv) means for passing said selected one of said multiplexer data inputs to said multiplexer output, said means having,
      (A) a plurality of inverters, each having,
        (1) a first input to receive an adjustable control voltage to compensate for temperature and power supply variations and component tolerance variables due to manufacturing;
        (2) a second input to receive one of said data outputs of said plurality of coarse delay elements or the data output of the last one of said plurality of fine delay elements; and
        (3) a data output;
      (B) a plurality of field effect transistors (FET) of a first-type conductivity, each having,
        (1) a gate electrode coupled to a respective one of said inverter data outputs to form an internal node therewith; and
        (2) a data output;
      (C) a FET of second-type conductivity opposite to said first-type, having,
        (1) an input to receive said adjustable control voltage; and
        (2) a data output coupled to each of said data outputs of said FETs having said first-type conductivity to thereby form said multiplexer output; and
      (D) means, coupled to each of said internal nodes, for receiving said fine gate time delay and coarse gate time delay control signals to enable a selected one of said plurality of FETs having said first-type conductivity to electrically connect the corresponding internal node to said multiplexer output, thereby propagating one of said data outputs of said plurality of coarse delay elements or the data output of the last one of said plurality of fine delay elements.

6. The system of claim 5, wherein said plurality of inverters are pseudo-PMOS inverters, said first-type conductivity is p-type and said second-type conductivity is n-type.

7. A method for delaying an input signal, comprising:
  (1) receiving the input signal into a plurality of fine delay elements coupled in series, for delaying the input signal thereby generating a finely delayed signal, each fine delay element having a data input, a data output and a control input;
  (2) receiving at said control inputs of said fine delay elements, a fine gate control time delay signal for specifying a predetermined amount of delay for each fine delay element to add to the signal applied to its respective data input;
  (3) passing said finely delayed signal to a plurality of coarse delay elements coupled in series, for further delaying said finely delayed signal, each coarse delay element having, a data input, a data output and a coarse delay element control input;
  (4) receiving at said coarse delay element control inputs, a coarse gate control time delay signal for specifying a predetermined amount of delay for each coarse delay element to add to the signal applied to its respective data input, wherein the data input of a first one of said plurality of coarse delay elements is coupled to the data output of a last one of said plurality of fine delay elements; and
  (5) selecting one of said data outputs of said plurality of coarse delay elements or the data output of the last one of said plurality of fine delay elements; and
  (6) outputting said selected data output.

* * * * *